US009942491B2

(12) United States Patent
Suzuki (10) Patent No.: US 9,942,491 B2
(45) Date of Patent: Apr. 10, 2018

(54) IMAGING DEVICE INCLUDING TWO SUBSTRATES (71) Applicant: OLYMPUS CORPORATION, Tokyo (JP)

(72) Inventor: Shunsuke Suzuki, Tokyo (JP)

(73) Assignee: OLYMPUS CORPORATION, Tokyo (JP)

(*) Notice: Subject to any disclaimer, the term of this patent is extended or adjusted under 35 U.S.C. 154(b) by 0 days.

(21) Appl. No.: 15/085,407

(22) Filed: Mar. 30, 2016

(65) Prior Publication Data
US 2016/0212361 A1 Jul. 21, 2016

Related U.S. Application Data (63) Continuation of application No. PCT/JP2014/074394, filed on Sep. 16, 2014.

(30) Foreign Application Priority Data

Oct. 8, 2013 (JP) .................................. 2013-211096

(51) Int. Cl.
H01L 27/146 (2006.01)
H04N 5/341 (2011.01)
(Continued)

(52) U.S. Cl.
CPC ............ H04N 5/341 (2013.01); H04N 5/374 (2013.01); H04N 5/376 (2013.01); H01L 27/14603 (2013.01)

(58) Field of Classification Search
None
See application file for complete search history.

(56) References Cited

U.S. PATENT DOCUMENTS

2008/0284888 A1* 11/2008 Kobayashi ............. H04N 5/374
348/308
2009/0185044 A1* 7/2009 Loose ................... H04N 3/1562
348/218.1

(Continued)

FOREIGN PATENT DOCUMENTS

JP 2011-3860 A 1/2011
JP 2011-49503 A 3/2011
JP 2011-159958 A 8/2011

OTHER PUBLICATIONS

International Search Report dated Dec. 2, 2014, issued in counterpart International Application No. PCT/JP2014/074394 (1 page).

Primary Examiner — Mark T Monk
(74) Attorney, Agent, or Firm — Westerman, Hattori, Daniels & Adrian, LLP (57) ABSTRACT An imaging device includes a first substrate, a second substrate, a plurality of connection nodes which electrically connect the first and second substrates, a pixel section arranged on the first substrate and including a plurality of pixels arranged in a matrix form, the plurality of pixels outputting pixel signals according to incident light, a row signal generation circuit arranged on the first substrate or the second substrate and configured to generate row selection signals, a column signal generation circuit arranged on the first substrate and configured to generate column-scanning signals, a block of column-scanning circuits arranged on the first substrate and which sequentially outputs the pixel signals output to every row from the pixels by scanning the columns according to the column-scanning signals, to every column, and a signal-processing circuit arranged on the second substrate and configured to process the pixel signals output from the block of column-scanning circuits.

5 Claims, 5 Drawing Sheets (51) Int. Cl.
*H04N 5/374* (2011.01)
*H04N 5/376* (2011.01)

(56) References Cited

U.S. PATENT DOCUMENTS

| | | |
|---|---|---|
| 2010/0201834 A1 | 8/2010 | Maruyama et al. |
| 2011/0049332 A1 | 3/2011 | Naruse et al. |
| 2013/0141620 A1* | 6/2013 | Nakajima .............. H04N 5/335 348/302 |

* cited by examiner

IMAGING DEVICE INCLUDING TWO SUBSTRATES

This application is a continuation application based on a PCT International Application No. PCT/JP2014/074394, filed on Sep. 16, 2014, whose priority is claimed on Japanese Patent Application No. 2013-211096, filed on Oct. 8, 2013. The contents of both of the PCT International Application and the Japanese Application are incorporated herein by reference.

BACKGROUND OF THE INVENTION

Field of the Invention

The present invention relates to an imaging device including two substrates.

Description of Related Art

Imaging devices including two substrates are known (for example, see Japanese Unexamined Patent Application, First Publication No. 2011-159958). Surfaces of the two substrates face and are adhered to each other. A plurality of pixels outputting pixel signals according to incident light are arranged in one of the two substrates. A signal transfer section configured to transfer pixel signals output from the plurality of pixels on the other of the two substrates and a signal-processing circuit configured to process transferred pixel signals are arranged on the other of the two substrates.

Figure 5:
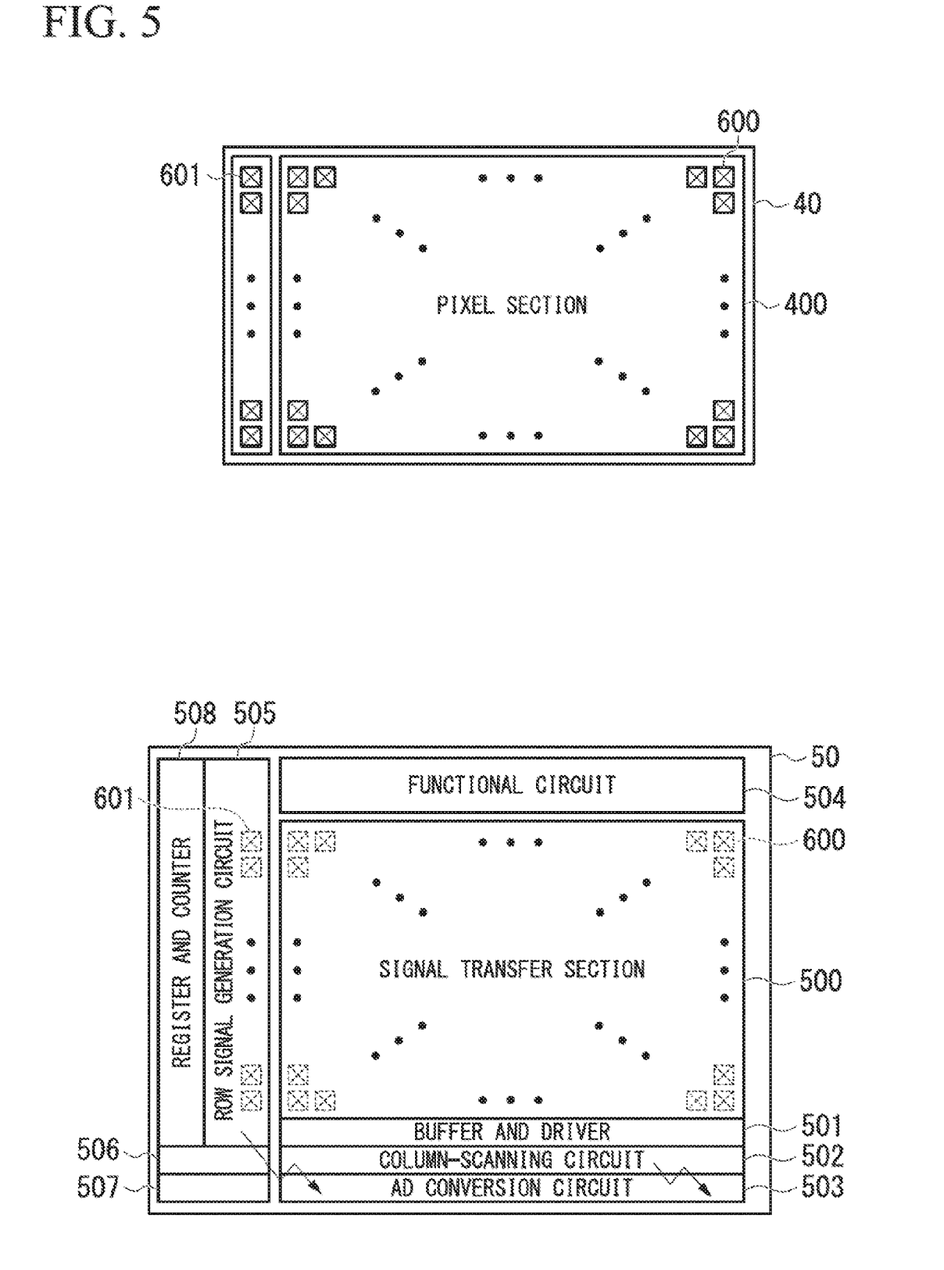
FIG. 5 is a block diagram showing a configuration of an imaging device which includes two substrates.

FIG. 5 shows an example of a configuration of an imaging device including two substrates. The imaging device shown in FIG. 5 includes a first substrate 40, a second substrate 50, and a connection section configured to connect the two substrates.

A pixel section 400 and connection nodes 600 and 601 are arranged on the first substrate 40. The pixel section 400 includes a plurality of pixels arranged in a matrix form outputting pixel signals according to incident light. The plurality of pixels output pixel signals to every row of an arrangement of the plurality of pixels. In other words, pixels in the same row simultaneously output pixel signals, and pixels in different rows output pixel signals at different timings.

Operations of the plurality of pixels are controlled by pixel control signals supplied from the second substrate 50. The pixel control signals are common signals for every row, in which states of pixel control signals supplied to pixels in the same row change at the same timing and states of pixel control signals supplied to pixels in different rows change at different timings. The pixel control signals include row selection signals which sequentially select rows in which pixels outputting pixel signals are arranged. Pixels in the same row selected by the row selection signals simultaneously output pixel signals.

The plurality of connection nodes 600 are arranged in the pixel section 400. Each of the connection nodes 600 is arranged at a position of one of the pixels. In other words, the plurality of connection nodes 600 are arranged in a matrix form. The number of rows in an arrangement of the plurality of connection nodes 600 is equal to the number of rows in an arrangement of the plurality of pixels. The number of columns in the arrangement of the plurality of connection nodes 600 is equal to the number of columns in the arrangement of the plurality of pixels. Also, the number of connection nodes 600 is equal to the number of pixels. One of the connection nodes 600 may also be shared among the plurality of pixels. The plurality of connection nodes 601 are arranged outside the pixel section 400. Each of the plurality of connection nodes 601 is arranged for one row in the arrangement of the plurality of pixels. In other words, the number of connection nodes 601 is equal to the number of rows in the arrangement of the plurality of pixels. One connection node 601 may also be arranged for each of the plurality of rows in the arrangement of the plurality of pixels. The connection nodes 600 and 601 constitute the connection section which electrically connects the first substrate 40 and the second substrate 50.

A signal transfer section 500, a block of buffers and driver's 501, a block of column-scanning circuits 502, a block of AD conversion circuits 503, a functional circuit 504, a row signal generation circuit 505, a column signal generation circuit 506, a control circuit 507, registers and counters 508, and the connection nodes 600 and 601 are arranged on the second substrate 50. The plurality of connection nodes 600 are arranged in the signal transfer section 500. The signal transfer section 500 transfers pixel signals, which are transferred to the second substrate 50 from the first substrate 40 via the connection nodes 600, to the block of buffers and drivers 501. The block of buffers and drivers 501 includes column buffers and line drivers for receiving the pixel signals. As the column-scanning circuit 502 scans a plurality of pixel columns according to column-scanning signals for scanning the plurality of pixel columns, the column-scanning circuit 502 sequentially outputs pixel signals, which are output to every row from the pixels, to every column. The AD conversion circuit 503 performs AD conversion on analog pixel signals output from the column-scanning circuit 502 and outputs digital pixel signals. The functional circuit 504 performs various types of image processing on pixel signals output from the AD conversion circuit 503 as necessary.

The row signal generation circuit 505 generates pixel control signals which include row selection signals. Pixel control signals generated by the row signal generation circuit 505 are transferred to the first substrate 40 from the second substrate 50 via the connection nodes 601 and are supplied to the pixels. The column signal generation circuit 506 generates the column-scanning signals. The control circuit 507 generates a control signal which controls the buffers and drivers 501, the AD conversion circuits 503, and the functional circuit 504.

The registers and counters 508 includes registers and counters necessary to generate signals (pixel control signals, column-scanning signals, and a control signal) by the row signal generation circuit 505, the column signal generation circuit 506, and the control circuit 507. The register stores a control value controlling a timing at which a state of each of the signals (High or Low) changes. The counter counts in synchronization with a predetermined clock and outputs a count value. The control value and the count value are output to the row signal generation circuit 505, the column signal generation circuit 506, and the control circuit 507. The row signal generation circuit 505, the column signal generation circuit 506, and the control circuit 507 change the state of each of the signals at a timing at which a count value output from the counter coincides with a control value output from the register.

Figure 6:
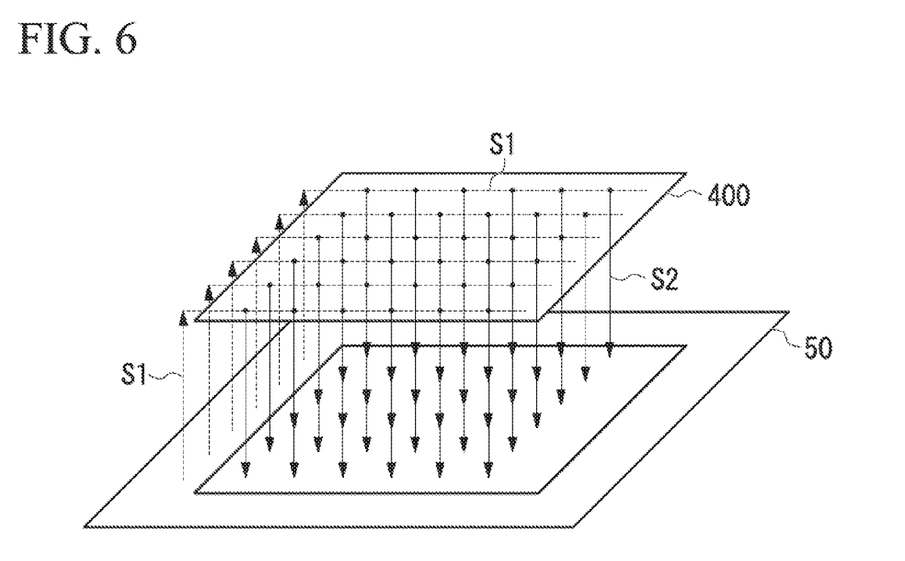
FIG. 6 is a schematic diagram showing a state in which signals are transferred between two substrates.

FIG. 6 shows a state in which signals are transferred between two substrates. Pixel control signals S1 generated by the row signal generation circuit 505 are transferred to the first substrate 40 not shown in FIG. 6 from the second substrate 50 via the connection nodes 601 of FIG. 5 and are supplied to pixels of the pixel section 400. Also, pixel signals S2 output from pixels of the pixel section 400 are transferred to the second substrate 50 from the first substrate 40 via the connection nodes 600 of FIG. 5.

In a situation in which the number of pixels is increased and high-speed driving of the pixels is progressing, pulses of row selection signals generated by the row signal generation circuit 505 may become noise on analog pixel signals AD-converted by the AD conversion circuit 503. Also, pulses of the column-scanning signals generated by the column signal generation circuit 506 and supplied to the column-scanning circuit 502 may cause noise in the analog pixel signals AD-converted by the AD conversion circuit 503. For this reason, errors may occur in AD conversion results of the AD conversion circuit 503.

Since the column-scanning circuit 502 scans columns while pixel signals of two different rows are output from pixels, the column-scanning signals are faster than the row selection signals. For this reason, it is easier for noise due to the pulses of the column-scanning signals to influence the AD conversion results of the AD conversion circuit 503.

SUMMARY OF THE INVENTION

According to a first aspect of the present invention, an imaging device includes; a first substrate; a second substrate; a plurality of connection nodes which electrically connect the first substrate and the second substrate; a pixel section arranged on the first substrate and including a plurality of pixels arranged in a matrix form, the plurality of pixels outputting pixel signals according to incident light; a row signal generation circuit arranged on the first substrate or the second substrate and configured to generate row selection signals which sequentially select the rows in which the pixels outputting the pixel signals are arranged and select each of the rows according to the row selection signals at intervals based on a first frequency; a column signal generation circuit arranged on the first substrate and configured to generate column-scanning signals scanning a plurality of pixel columns and scan each of the columns according to the column-scanning signals at intervals based on a second frequency higher than the first frequency; a block of column-scanning circuits arranged on the first substrate and which sequentially outputs, to every column, the pixel signals output to every row from the pixels by scanning the columns according to the column-scanning signals; and a signal-processing circuit arranged on the second substrate and configured to process the pixel signals output from the block of column-scanning circuits.

According to a second aspect of the present invention, in the imaging device according to the first aspect, the row signal generation circuit may be arranged on the first substrate.

According to a third aspect of the present invention, in the imaging device according to the second aspect, the plurality of connection nodes may be configured as a serial peripheral interface, and a control value controlling a timing at which a state of each of the row selection signals changes may be transferred to the first substrate from the second substrate via the serial peripheral interface.

According to a fourth aspect of the present invention, in the imaging device according to the first aspect, each of the plurality of connection nodes may be arranged at a position corresponding to each of the plurality of pixels arranged in the pixel section, or each of the plurality of connection nodes may be arranged at a position corresponding to every multiple pixels of the plurality of pixels arranged in the pixel section, or each of the plurality of connection nodes may be arranged at a position corresponding to every row of the plurality of pixels arranged in the pixel section, or each of the plurality of connection nodes may be arranged at a position corresponding to every multiple rows of the plurality of pixels arranged in the pixel section, or each of the plurality of connection nodes may be arranged at a position corresponding to every column of the plurality of pixels arranged in the pixel section, or each of the plurality of connection nodes may be arranged at a position corresponding to every multiple columns of the plurality of pixels arranged in the pixel section.

DETAILED DESCRIPTION OF THE INVENTION

Hereinafter, embodiments of the present invention will be described with reference to the drawings.

First Embodiment

Figure 1:
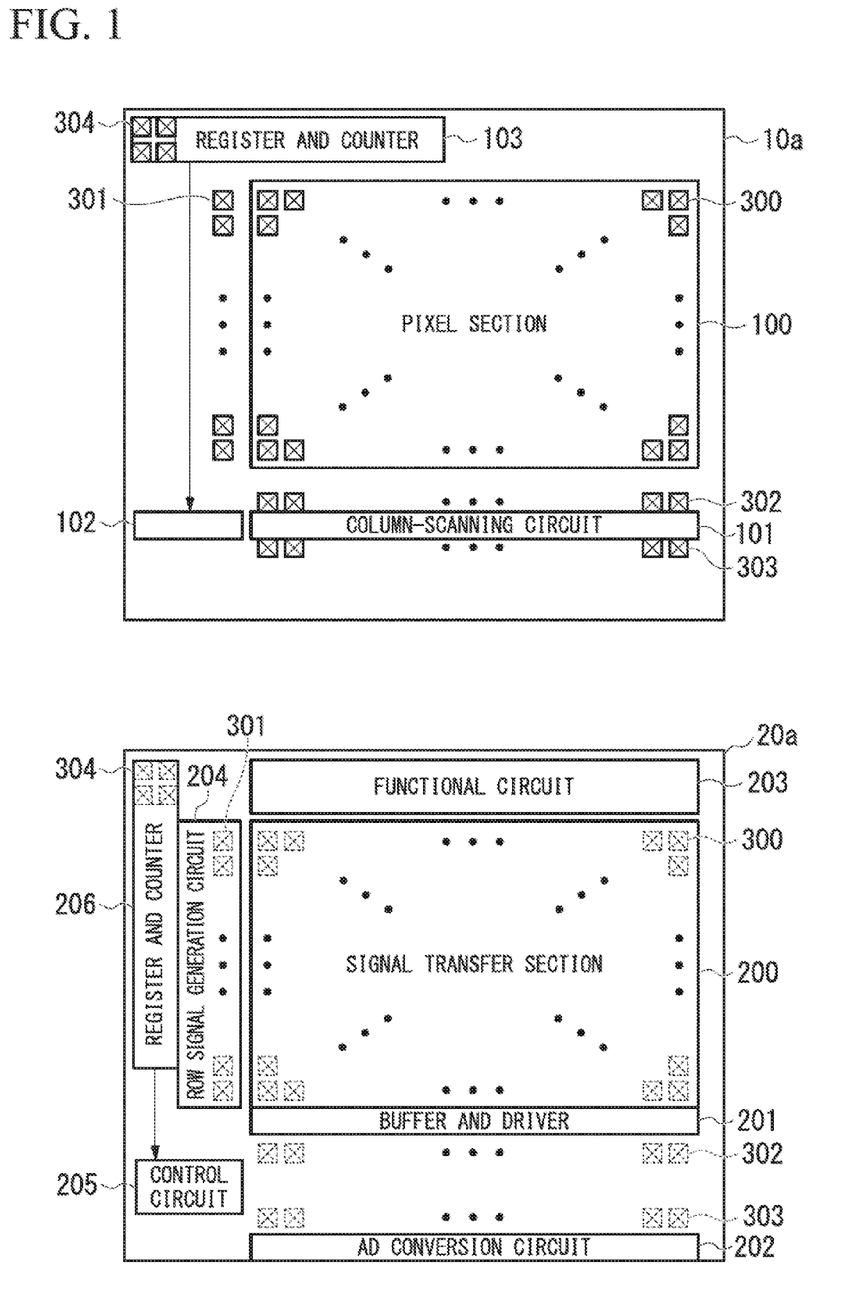
FIG. 1 is a block diagram showing a configuration of an imaging device according to a first embodiment of the present invention.

First, a first embodiment of the present invention will be described. FIG. 1 shows a configuration of an imaging device according to the embodiment. The imaging device shown in FIG. 1 includes a first substrate 10a, a second substrate 20a, and a connection section configured to connect the two substrates.

A pixel section 100, a block of column-scanning circuits 101, a column signal generation circuit 102, registers and counters 103, and connection nodes 300, 301, 302, 303, and 304 are arranged on the first substrate 10a. The pixel section 100 includes a plurality of pixels arranged in a matrix form outputting pixel signals according to incident light. The plurality of pixels output pixel signals to every row of an arrangement of the plurality of pixels. In other words, pixels in the same row simultaneously output pixel signals, and pixels in different rows output pixel signals at different timings.

Operations of the plurality of pixels are controlled by pixel control signals supplied from the second substrate 20a. The pixel control signals are common signals for every row. States of pixel control signals supplied to pixels in the same row change at the same timing. States of pixel control signals supplied to pixels in different rows change at different timings. The pixel control signals include row selection signals which sequentially select rows in which pixels outputting pixel signals are arranged. Pixels in the same row selected by the row selection signals simultaneously output pixel signals.

Each of the pixels includes a photoelectric conversion element, a charge storage section (capacitance or diffusion region), a transfer section (a transfer transistor), a signal generation section (an amplifier transistor), and an output section (an output transistor). The photoelectric conversion element converts incident light into signal charges. The charge storage section accumulates signal charges. The transfer section transfers signal charges from the photoelectric conversion element to the charge storage section. The signal generation section generates pixel signals based on signal charges accumulated in the charge storage section. The output section outputs pixel signals based on the row selection signals.

As the column-scanning circuit 101 scans a plurality of pixel columns according to column-scanning signals for scanning the plurality of pixel columns, the column-scanning circuit 101 sequentially outputs pixel signals, which are output to every row from the pixels, to every column. The column signal generation circuit 102 generates column-scanning signals. The registers and counters 103 include registers and counters necessary to generate column-scanning signals by the column signal generation circuit 102. The register stores a control value controlling a timing at which a state of each of the column-scanning signals (High or Low) changes. The counter counts in synchronization with a predetermined clock and outputs a count value. The control value and the count value are output to the column-scanning circuit 101. The column-spoiling circuit 101 changes the state of the column-scanning signal at a timing at which a count value output from the counter coincides with a control value output from the register.

The plurality of connection nodes 300 are arranged in the pixel section 100. Each of the connection nodes 300 is arranged at a position of one of the pixels. In other words, the plurality of connection nodes 300 are arranged in a matrix form. The number of rows in an arrangement of the plurality of connection nodes 300 is equal to the number of rows in an arrangement of the plurality of pixels. The number of columns in an arrangement of the plurality of connection nodes 300 is equal to the number of columns in the arrangement of the plurality of pixels. Also, the number of connection nodes 300 is equal to the number of pixels. One of the connection nodes 300 may be shared among the plurality of pixels. The plurality of connection nodes 301 are arranged outside the pixel section 100. Each of the plurality of connection nodes 301 is arranged for one row in the arrangement of the plurality of pixels. In other words, the number of connection nodes 301 is equal to the number of rows in the arrangement of the plurality of pixels. The connection nodes 301 may be arranged for each of the plurality of rows in the arrangement of the plurality of pixels.

Also, the plurality of connection nodes 302 and 303 are arranged near the block of column-scanning circuits 101.

Each of the connection nodes 302 and 303 is arranged for one column in the arrangement of the plurality of pixels. In other words, the numbers of connection nodes 302 and 303 are equal to the number of columns in the arrangement of the plurality of pixels. The connection nodes 300, 301, 302, and 303 constitute a connection section which electrically connects the first substrate 10a and the second substrate 20a.

A signal transfer section 200, a block of buffers and drivers 201, a block of AD conversion circuits 202, a functional circuit 203, a row signal generation circuit 204, a control circuit 205, registers and counters 206, and the connection nodes 300, 301, 302, 303, and 304 are arranged on the second substrate 20a. The plurality of connection nodes 300 are arranged in the signal transfer section 200.

The signal transfer section 200 transfers pixel signals, which are transferred to the second substrate 20a from the first substrate 10a via the connection nodes 300, to the block of buffers and driver's 201.

The block of buffers and drivers 201 includes column buffers for receiving pixel signals and line drivers. The connection nodes 302 are arranged near the block of buffers and driver's 201. Pixel signals output from the block of buffers and driver's 201 are transferred to the first substrate 10a from the second substrate 20a via the connection nodes 302. The pixel signals transferred to the first substrate 10a pass through the block of column-scanning circuits 101 and are transferred to the second substrate 20a from the first substrate 10a via the connection nodes 303. The pixel signals transferred to the second substrate 20a are input to the block of AD conversion circuits 202.

The AD conversion circuit 202 performs AD conversion on analog pixel signals and outputs digital pixel signals. The functional circuit 203 performs various types of image processing on pixel signals output from the AD conversion circuit 202 as necessary. The row signal generation circuit 204 generates pixel control signals which include row selection signals. The pixel control signals generated by the row signal generation circuit 204 are transferred to the first substrate 10a from the second substrate 20a via the connection nodes 301 and are supplied to the pixels. The control circuit 205 generates a control signal which controls the block of buffers and drivers 201, the block of AD conversion circuits 202, and the functional circuit 203.

The registers and counters 206 include registers and counters necessary to generate signals (pixel control signals and a control signal) by the row signal generation circuit 204 and the control circuit 205. The register stores a control value controlling a timing at which a state of each of the signals (High or Low) changes. The counter counts in synchronization with a predetermined clock and outputs a count value. The control value and the count value are output to the row signal generation circuit 204 and the control circuit 205. The row signal generation circuit 204 and the control circuit 205 change the state of each of the signals at a timing at which a count value output from the counter coincides with a control value output from the register.

The registers and counters 103 are connected to tire registers and counter's 206 via, for example, the four connection nodes 304. Control values stored in the registers and counters 103 are input to the registers and counters 206 from the outside and are transferred to the registers and counters 103 via the connection nodes 304. The connection nodes 304 constitute the connection section along with the connection nodes 300, 301, 302, and 303. The connection nodes 304 can be configured as, for example, a serial peripheral interface (SPI).

Figure 2:
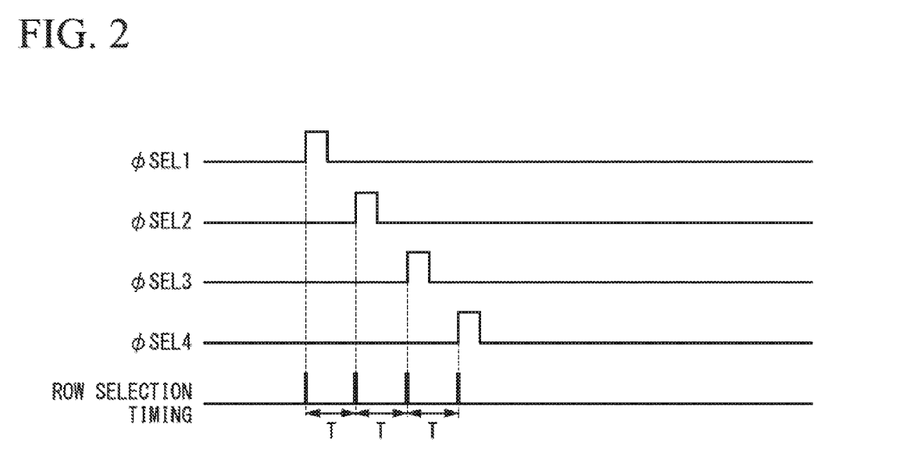
FIG. 2 is a timing chart showing row selection signals of rows and timings at which the rows are selected in the first embodiment of the present invention.

FIG. 2 shows examples of row selection signals of rows generated by the row signal generation circuit 204 and timings at which the rows are selected. FIG. 2 shows row selection signals of four rows φSEL1, φSEL2, φSEL3, and φSEL4. The horizontal direction of FIG. 2 indicates time. The vertical direction of FIG. 2 indicates voltages of row selection signals. For example, a first row is selected at a timing at which the row selection signal φSEL1 changes from Low to High. A second row is selected at a timing at which the row selection signal φSEL2 changes from Low to High. A third row is selected at a timing at which the row selection signal φSEL3 changes from Low to High. A fourth row is selected at a timing at which the row selection signal φSEL4 changes from Low to High.

An interval T between timings at which rows are selected is an interval between timings at which outputs of a shift register are shifted by one stage, for example, when the row signal generation circuit 204 is constituted by the shift register. In other words, the interval is a reciprocal of a frequency (hereinafter referred to as a first frequency) of a control signal for shifting the outputs of the shift register (a control signal for changing a state of the row selection signals of each of the rows). Thus, selection of each of the rows according to the row selection signals is performed at the interval T based on the first frequency.

Figure 3:
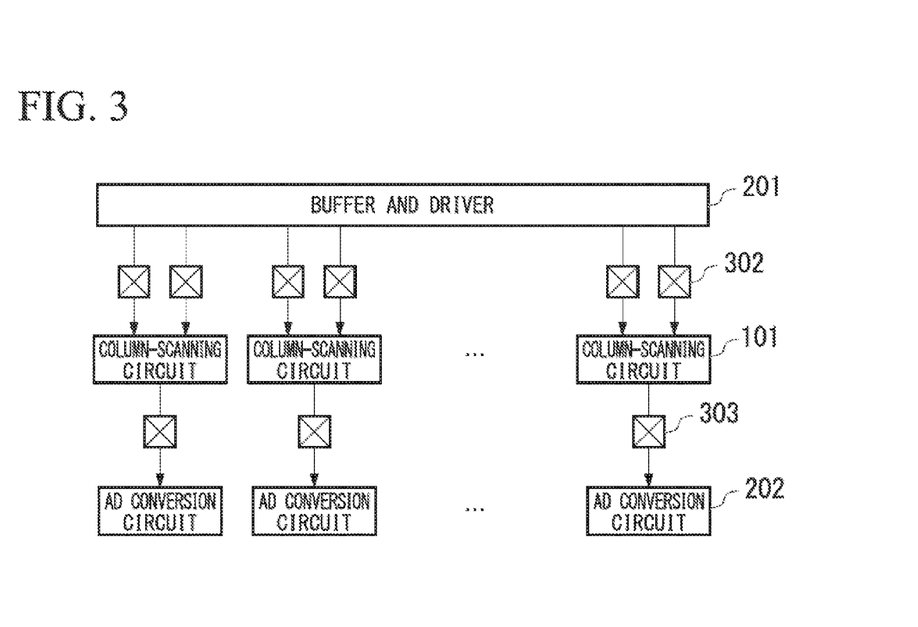
FIG. 3 is a block diagram showing a connection relationship in the first embodiment of the present invention.

FIG. 3 shows connections between the block of buffers and drivers 201 and the block of column-scanning circuits 101. FIG. 3 shows connections between the block of column-scanning circuits 101 and the block of AD conversion circuits 202. In an example shown in FIG. 3, one each of the column-scanning circuits 101 and the AD conversion circuits 202 is arranged in every two columns. The pixel signals output from the block of buffers and drivers 201 are transferred to the block of column-scanning circuits 101 via the connection nodes 302. One column-scanning circuit of the block of column-spoiling circuits 101 scans two columns and sequentially outputs pixel signals of the two columns. The pixel signals output from the block of column-scanning circuits 101 are transferred to the block of AD conversion circuits 202 via the connection nodes 303. The pixel signals of the two columns are sequentially input to one of the block of AD conversion circuits 202. One each of the column-scanning circuits 101 and the AD conversion circuits 202 may be arranged in every three or more columns.

When the number of columns scanned by one column-scanning circuit of the block of column-scanning circuits 101 is set to N (N≥2), an arbitrary row is selected by row selection signals and pixel signals are simultaneously output from pixels of the one row. Then, while another arbitrary row is selected by the row selection signals and pixel signals are simultaneously output from pixels of the one row, one column-scanning circuit of the block of column-scanning circuits 101 scans N columns. Therefore, scanning of each of the columns according to the column-scanning signals is performed at intervals based on a second frequency higher than the first frequency. In the example shown in FIG. 3, the second frequency is N times the first frequency.

According to the embodiment, an imaging device is provided, including the first substrate 10a, the second substrate 20a, the connection section which electrically connects the first substrate 10a and the second substrate 20a (the connection nodes 300, 301, 302, 303, and 304), the pixel section 100 arranged on the first substrate 10a and including the plurality of pixels arranged in a matrix form outputting the pixel signals according to incident light, the row signal generation circuit 204 arranged on the first substrate 10a or the second substrate 20a and configured to generate the row selection signals which sequentially select the rows in which the pixels outputting the pixel signals are arranged and select each of the rows according to the row selection signals at intervals based on the first frequency, the column signal generation circuit 102 arranged on the first substrate 10a and configured to generate the column-scanning signals scanning the plurality of pixel columns and scan each of the columns according to the column-scanning signal at intervals based on the second frequency higher than the first frequency, the column-scanning circuit 101 arranged on the first substrate 10a and which sequentially outputs the pixel signals, which are output to every row from the pixels by scanning the columns according to the column-scanning signals, to every column, and a signal-processing circuit (one AD conversion circuit of the block of AD conversion circuit 202) arranged on the second substrate 20a and configured to process the pixel signals output from the block of column-scanning circuits 101.

While the column signal generation circuit 506 and the block of column-scanning circuits 502 are arranged on the same substrate as the block of AD conversion circuits 503 in an imaging device shown in FIG. 5, the column signal generation circuit 102 and the block of column-scanning circuits 101 are arranged in a different substrate from the block of AD conversion circuits 202 in the imaging device shown in FIG. 1. Thus, since the block of AD conversion circuits 202 is hardly affected by the column-scanning signals, the block of AD conversion circuit 202 is hardly affected by noise. Since the counters for generating the column-scanning signals are also arranged on the first substrate 10a, the block of AD conversion circuits 202 is affected less by noise. A more remarkable effect can be obtained by applying the embodiment to an imaging device including a circuit configured to perform signal processing susceptible to noise such as high-resolution AD conversion.

Second Embodiment

Figure 4:
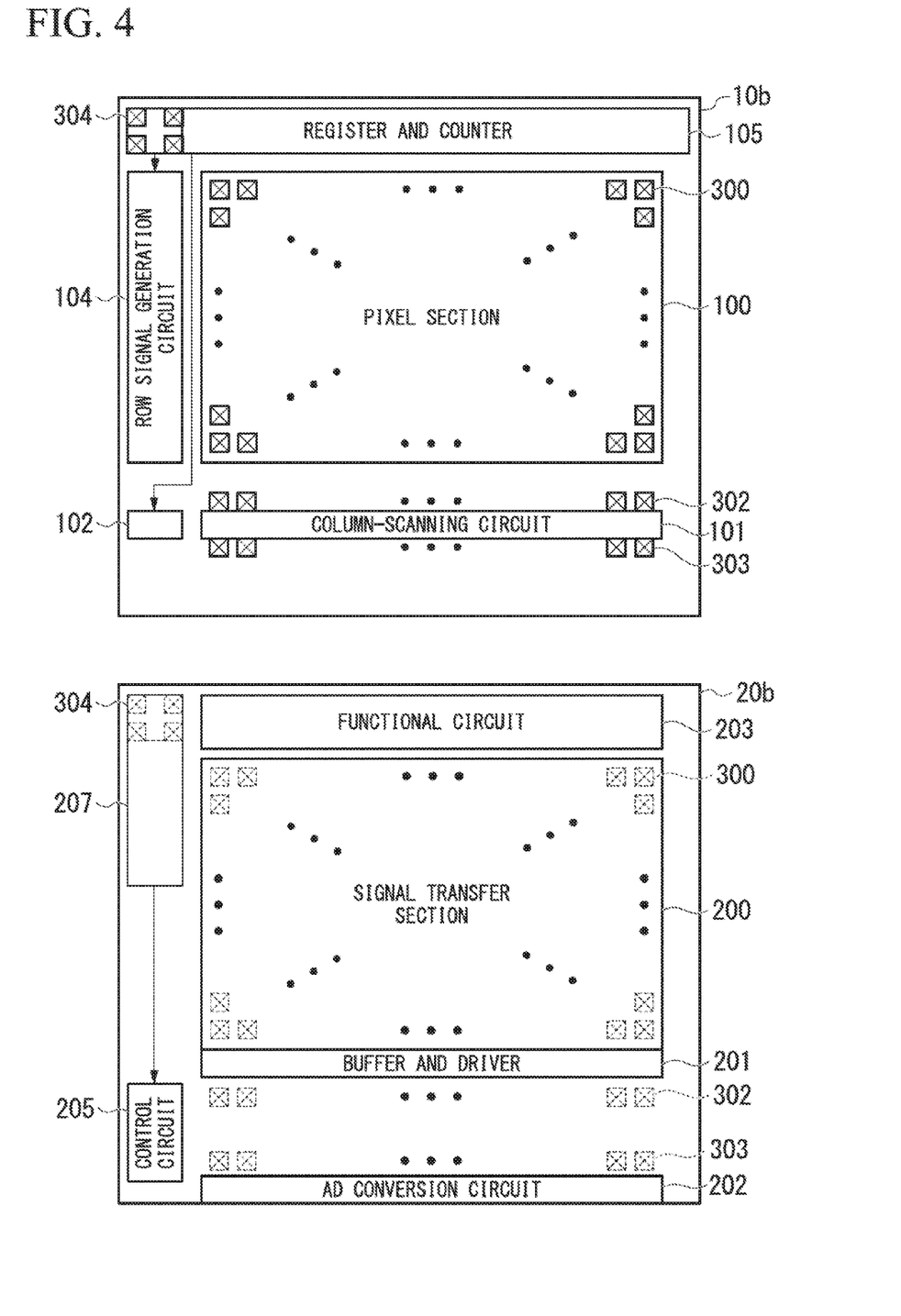
FIG. 4 is a block diagram showing a configuration of an imaging device according to a second embodiment of the present invention.

Next, a second embodiment of the present invention will be described. FIG. 4 shows a configuration of an imaging device related to the embodiment. The imaging device shown in FIG. 4 includes a first substrate 10b, a second substrate 20b, and a connection section configured to connect the two substrates.

The pixel section 100, the block of column-scanning circuits 101, the column signal generation circuit 102, a row signal generation circuit 104, registers and counters 105, and the connection nodes 300, 302, 303, and 304 are arranged on the first substrate 10b. The row signal generation circuit 104 generates pixel control signals which include row selection signals. The register's and counters 105 include registers and counter's necessary for the column signal generation circuit 102 and the row signal generation circuit 104 to generate signals (column-scanning signals and pixel control signals). The register stores a control value controlling a timing at which a state of each of the signals (High or Low) changes. The counter counts in synchronization with a predetermined clock and outputs a count value. The control value and the count value are output to the column signal generation circuit 102 and the row signal generation circuit 104. The column signal generation circuit 102 and the row signal generation circuit 104 change the state of each of the signals at a timing when a count value output from the counter coincides with a control value output from the register. The remaining configuration of the first substrate 10b is the same as the configuration of the imaging device shown in FIG. 1.

The signal transfer section 200, the block of buffers and driver's 201, the block of AD conversion circuits 202, the functional circuit 203, the control circuit 205, registers and counters 207, and the connection nodes 300, 302, 303, and 304 are arranged on the second substrate 20b. The registers and counter's 207 include registers and counters necessary to generate a control signal by the control circuit 205. The register stores a control value controlling a timing at which a state of the control signal (High or Low) changes. The counter counts in synchronization with a predetermined clock and outputs a count value. The control value and the count value are output to the control circuit 205. The control circuit 205 changes the state of the control signal at a timing at which a count value output from the counter coincides with a control value output from the register. The remaining configuration of the second substrate 20b is the same as the configuration of the imaging device shown in FIG. 1.

The registers and counters 105 are connected to the registers and counters 207 via, for example, the four connection nodes 304. A control value stored in the register's and counters 105 is input to the registers and counters 207 from the outside and is transferred to the registers and counters 105 via the connection nodes 304. As with the first embodiment, the connection nodes 304 can be configured as, for example, a serial peripheral interface (SPI).

In the present embodiment, the row signal generation circuit 104 is arranged on the first substrate 10b. Thus, the block of AD conversion circuits 202 is hardly affected by the pixel control signals generated by the row signal generation circuit 104. For this reason, the block of AD conversion circuits 202 is affected by noise even less than in the first embodiment. Since the counter for generating the pixel control signals is also arranged on the first substrate 10b, the block of AD conversion circuits 202 is affected less by noise.

In the present embodiment, since the row signal generation circuit 104 is arranged on the first substrate 10b, same configuration as the connection nodes 301 disclosed in the first embodiment are omitted. Therefore, the number of connection nodes can be reduced compared with the first embodiment.

The connection nodes 301 form capacitances in transmission lines of the pixel control signals and are capable of serving as loads. For this reason, loads related to the pixel control signals can be reduced in the present embodiment. Thus, deterioration of waveforms of the pixel control signals can be reduced and high-precision pixel control signals can be supplied to pixels. Also, a driving voltage can be lowered by reducing loads, and electric power consumption can be reduced.

Although embodiments of the present invention have been described above in detail with reference to the drawings, the specific constitution is not limited to the embodiments. Changes in design, etc. without departing from the gist of the present invention are also included. Although a configuration of an imaging device in which two substrates are connected through a connection section is shown in the above-mentioned embodiments, three or more substrates may be connected through a connection section, in the case of an imaging device in which three or more substrates are connected through a connection section, two substrates among the three or more substrates correspond to the first substrate and the second substrate.

While preferred embodiments of the invention have been described and illustrated above, it should be understood that these are exemplary of the invention and are not to be considered as limiting. Additions, omissions, substitutions, and other modifications can be made without departing from the spirit and scope of the present invention. Accordingly, the invention is not to be considered as being limited by the foregoing description, and is only limited by the scope of the appended claims.

What is claimed is:

1. An imaging device, comprising:
a first substrate;
a second substrate;
a plurality of connection nodes which electrically connect the first substrate and the second substrate;
a pixel section arranged on the first substrate and including a plurality of pixels arranged in a matrix form, the plurality of pixels outputting pixel signals according to incident light;
a row signal generation circuit arranged on the first substrate or the second substrate and configured to generate row selection signals which sequentially select the rows in which the pixels outputting the pixel signals are arranged and select each of the rows according to the row selection signals at intervals based on a first frequency;
a column signal generation circuit arranged on the first substrate and configured to generate column-scanning signals scanning a plurality of pixel columns and scan each of the columns according to the column-scanning signals at intervals based on a second frequency higher than the first frequency;
a block of column-scanning circuits arranged on the first substrate and which sequentially output the pixel signals, which are output to every row from the pixels by scanning the columns according to the column-scanning signals, to every column; and
an AD conversion circuit arranged on the second substrate and configured to process the pixel signals output from the block of column-scanning circuits.

2. The imaging device according to claim 1, wherein the row signal generation circuit is arranged on the first substrate.

3. The imaging device according to claim 2, wherein
the plurality of connection nodes are configured as a serial peripheral interface, and
a control value controlling a timing at which a state of each of the row selection signals changes is transferred to the first substrate from the second substrate via the serial peripheral interface.

4. The imaging device according to claim 1, wherein
each of the plurality of connection nodes is arranged at a position corresponding to each of the plurality of pixels arranged in the pixel section, or
each of the plurality of connection nodes is arranged at a position corresponding to every multiple pixels of the plurality of pixels arranged in the pixel section, or
each of the plurality of connection nodes is arranged at a position corresponding to every row of the plurality of pixels arranged in the pixel section, or
each of the plurality of connection nodes is arranged at a position corresponding to every multiple rows of the plurality of pixels arranged in the pixel section, or
each of the plurality of connection nodes is arranged at a position corresponding to every column of the plurality of pixels arranged in the pixel section, or
each of the plurality of connection nodes is arranged at a position corresponding to every multiple columns of the plurality of pixels arranged in the pixel section.

5. The imaging device according to claim 1, further includes a block of register and counter circuits arranged on the first substrate,
wherein the block of register and counter circuits includes registers and counters which are arranged for the row signal generation circuit and the column signal generation circuit to generate the row selection signals and the column-scanning signals, respectively.

* * * * *